(12) United States Patent
Wang et al.

(10) Patent No.: US 11,121,332 B2
(45) Date of Patent: Sep. 14, 2021

(54) FOLDABLE ARRAY SUBSTRATE, PREPARATION METHOD THEREOF AND DISPLAY DEVICE

(71) Applicant: KunShan Go-Visionox Opto-Electronics Co., Ltd., Kunshan (CN)

(72) Inventors: Gang Wang, Kunshan (CN); Lu Zhang, Kunshan (CN); Zhenzhen Han, Kunshan (CN); Siming Hu, Kunshan (CN); Hui Zhu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 378 days.

(21) Appl. No.: 16/410,271

(22) Filed: May 13, 2019

(65) Prior Publication Data

US 2019/0267558 A1    Aug. 29, 2019

Related U.S. Application Data

(63) Continuation of application No. PCT/CN2018/088958, filed on May 30, 2018.

(30) Foreign Application Priority Data

Aug. 31, 2017    (CN) .......................... 201710773088.4

(51) Int. Cl.
*H01L 51/00*    (2006.01)
*H01L 27/32*    (2006.01)
(Continued)

(52) U.S. Cl.
CPC ............ *H01L 51/0097* (2013.01); *G09F 9/30* (2013.01); *G09F 9/33* (2013.01); *H01L 27/12* (2013.01);
(Continued)

(58) Field of Classification Search
CPC ...................................................... H01L 51/00
See application file for complete search history.

(56) References Cited

U.S. PATENT DOCUMENTS

| | | | |
|---|---|---|---|
| 2016/0029473 A1 | 1/2016 | Zang et al. |
| 2017/0069701 A1 | 3/2017 | Cai |

(Continued)

FOREIGN PATENT DOCUMENTS

| | | |
|---|---|---|
| CN | 102790094 A | 11/2012 |
| CN | 103545320 A | 1/2014 |

(Continued)

OTHER PUBLICATIONS

Japanese Notice of Reasons for Refusal in Japanese Application No. 2019-555617 dated Nov. 17, 2020.

(Continued)

*Primary Examiner* — Marvin Payen
(74) *Attorney, Agent, or Firm* — Rimon PC

(57) ABSTRACT

The present application provides a foldable array substrate, a preparation method thereof and a display device. The foldable array substrate includes a base substrate, a gate metal layer disposed on one side of the base substrate, a source-drain metal layer disposed on the side of the gate metal layer opposite to the base substrate, and an insulating layer disposed between the gate metal layer and the source-drain metal layer. A plurality of holes are disposed on the foldable array substrate, and the holes are disposed between adjacent pixel units of a plurality of pixel units, and extend from the side of the insulating layer opposite to the base substrate toward the base substrate.

20 Claims, 3 Drawing Sheets

(51) Int. Cl.
   H05K 1/02    (2006.01)
   H05K 1/11    (2006.01)
   H05K 3/32    (2006.01)
   G09F 9/33    (2006.01)
   G09F 9/30    (2006.01)
   H01L 27/12   (2006.01)
(52) U.S. Cl.
   CPC ...... *H01L 27/3244* (2013.01); *H01L 27/3262* (2013.01); *H05K 1/0281* (2013.01); *H05K 1/118* (2013.01); *H05K 3/326* (2013.01); *H01L 27/3211* (2013.01); *H01L 27/3276* (2013.01)

(56) References Cited

U.S. PATENT DOCUMENTS

| | | | |
|---|---|---|---|
| 2017/0179441 | A1 | 6/2017 | Lee et al. |
| 2017/0186827 | A1 | 6/2017 | You et al. |
| 2019/0312092 | A1 | 10/2019 | Kimura et al. |

FOREIGN PATENT DOCUMENTS

| | | | |
|---|---|---|---|
| CN | 103700320 | A | 4/2014 |
| CN | 104103648 | A | 10/2014 |
| CN | 104795403 | A | 7/2015 |
| CN | 105845701 | A | 8/2016 |
| CN | 106997883 | A | 8/2017 |
| EP | 1594118 | A1 | 11/2005 |
| EP | 3032585 | A1 | 6/2016 |
| JP | 2012-243935 | A | 12/2012 |
| JP | 2015-050181 | A | 3/2015 |
| JP | 2017-116904 | A | 6/2017 |
| KR | 10-2005-0052642 | A | 6/2005 |

OTHER PUBLICATIONS

European Search Report in European Application No. 18851732.0 dated May 4, 2020.
PCT International Search Report dated Aug. 24, 2018 in International Application No. PCT/CN2018/088958.
PCT Written Opinion of PCT/CN2018/088958 dated Aug. 24, 2018.
Chinese First Office Action for CN Application No. 201710773088.4 dated May 31, 2019.
Taiwan First Office Action for Application No. 107124025 dated May 30, 2019.
Korean Intellectual Property Office, Korean Notice of Reasons for Refusal in Application No. 10-2019-7028660 dated Jul. 13, 2021.

FOLDABLE ARRAY SUBSTRATE, PREPARATION METHOD THEREOF AND DISPLAY DEVICE

CROSS-REFERENCE TO RELATED APPLICATIONS

This application is a continuation of International Application No. PCT/CN2018/088958, filed on May 30, 2018, which claims priority to Chinese Patent Application No. CN 201710773088.4, filed on Aug. 31, 2017. Both applications are incorporated herein by reference in their entireties.

TECHNICAL FIELD

The present application relates to the field of foldable display technologies, and in particular, to a foldable array substrate, a preparation method thereof and a display device.

BACKGROUND

A flexible foldable display, such as an Organic Light Emitting Display (OLED), may provide users with new visual experience. However, after repeated bending of the display, a phenomenon of device failure is easily generated, thereby affecting displaying.

A current solution is to perform wire change processing between pixel units, that is, the anti-bending capacity of the device is enhanced by using a wire routing with better anti-bending performance. However, the solution is not suitable for flexible displays with higher pixel density (high PPI).

Therefore, it is urgent to propose a more widely applied technology that can improve the anti-bending capacity of, for example, a high PPI device.

SUMMARY

Embodiments of the present application provide a foldable array substrate, a preparation method thereof and a display device, which may improve the anti-bending capacity of the foldable array substrate by reducing the stress of the foldable array substrate.

One aspect of the present application provides a foldable array substrate. The foldable array substrate includes a base substrate, a gate metal layer disposed on one side of the base substrate, a source-drain metal layer disposed on the side of the gate metal layer opposite to the base substrate, and an insulating layer disposed between the gate metal layer and the source-drain metal layer. The gate metal layer includes a gate line, the source-drain metal layer includes a data line, and the gate line is arranged in an intersecting manner with the data line to define a plurality of pixel units on the base substrate. The foldable array substrate further includes a plurality of holes, which are disposed between adjacent pixel units of the plurality of pixel units, and extend from the side of the insulating layer opposite to the base substrate toward the base substrate.

In an embodiment, the foldable array substrate further includes a preset punching area between two rows of pixel units adjacent to each other and/or between two columns of pixel units adjacent to each other, and the plurality of holes are disposed in the preset punching area.

In an embodiment, the width of the preset punching area is in the range of 2 micrometers to 10 micrometers.

In an embodiment, the plurality of holes at least include a first type of holes, and the first type of holes do not intersect with the metal of each metal layer of the foldable array substrate.

In an embodiment, the first type of holes extend from one side of the insulating layer opposite to the base substrate to the base substrate.

In an embodiment, the foldable array substrate further includes a buffer layer disposed on the side of the base substrate and in contact with the base substrate, and the first type of holes extend from one side of the insulating layer opposite to the base substrate toward the base substrate to the buffer layer.

In an embodiment, the plurality of holes further include a second type of holes, and the second type of holes extend from one side of the insulating layer opposite to the base substrate to a metal wiring in the gate metal layer.

In an embodiment, the foldable array substrate further includes at least two rows of pixel units adjacent to each other, and the plurality of holes include a first hole-slot extending along a length direction of the gate line between the two rows of pixel units.

In an embodiment, the foldable array substrate further includes a buffer layer disposed on the side of the base substrate and in contact with the base substrate, and the first hole-slot extends from one side of the insulating layer opposite to the base substrate to the buffer layer.

In an embodiment, the plurality of holes further include a plurality of holes extending along a length direction of the data line.

In an embodiment, the plurality of holes extending along a length direction of the data line extend from one side of the insulating layer opposite to the base substrate to the buffer layer.

In an embodiment, the foldable array substrate further includes at least two columns of pixel units adjacent to each other, and between the two columns of pixel units, the plurality of holes include a second hole-slot extending along a length direction of the data line.

In an embodiment, the second hole-slot includes a portion extending from one side of the insulating layer opposite to the base substrate to the buffer layer and a portion extending to the gate line.

In an embodiment, the foldable array substrate further includes a capacitor layer between the gate metal layer and the source-drain metal layer, and the insulating layer includes a first insulating layer disposed between the capacitor layer and the source-drain metal layer, and a second insulating layer disposed between the capacitor layer and the gate metal layer.

In an embodiment, the insulating layer is made of inorganic silicon material.

In an embodiment, the inorganic silicon material includes at least one of silicon oxide and silicon nitride.

Another aspect of the present application provides an OLED display device including the foldable array substrate mentioned above.

Another aspect of the present application provides a preparation method of a foldable array substrate including: forming an active layer pattern, a gate metal layer pattern, and an insulating layer on one side of a base substrate, the gate metal layer pattern includes a gate line; and forming a plurality of holes extending from one side of the insulating layer opposite to the base substrate toward the base substrate, and the plurality of holes are formed between adjacent pixel units of the plurality of pixel units.

In an embodiment, the forming a plurality of holes extending from one side of the insulating layer opposite to the base substrate toward the base substrate includes: forming a first hole-slot extending along a length direction of the gate line between at least one pair of two rows of pixel units adjacent to each other.

In an embodiment, the method further includes: forming a source-drain metal layer pattern after the forming a plurality of holes extending from one side of the insulating layer opposite to the base substrate toward the base substrate, and the source-drain metal layer pattern includes a data line. The forming a plurality of holes extending from one side of the insulating layer opposite to the base substrate toward the base substrate further includes: forming a second hole-slot extending along a length direction of the date line between at least one pair of two columns of pixel units adjacent to each other.

The foldable array substrate and the OLED display device according to the embodiments of the present application effectively improve the stress concentration phenomenon by punching a hole outside pixel units of the foldable array substrate, thereby improving the bending performance of the device.

DETAILED DESCRIPTION

Figure 1A:
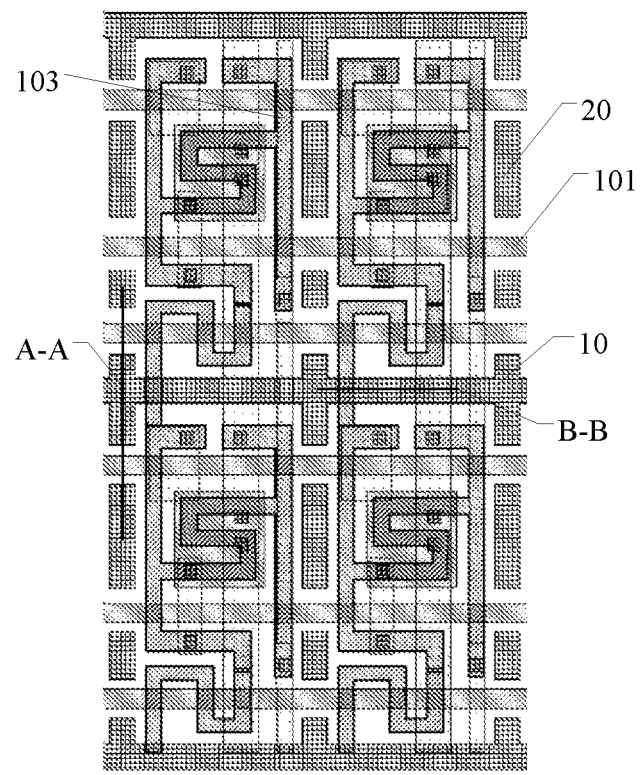
FIG. 1a is a schematic structural diagram of an array substrate according to an embodiment of the present application.

In the following detailed description, embodiments will be described with reference to the accompanying drawings. However, the present application may be embodied in various different forms, and should not be construed as being limited only to the illustrated embodiments. Rather, these embodiments are provided as examples, simply by way of illustrating the concept of the present application to those skilled in the art. Accordingly, processes, elements, and techniques that should be apparent to those of ordinary skill in the art are not described herein.

One aspect of the present application provides a foldable array substrate (hereinafter referred to as an array substrate). Referring to FIG. 1a to FIG. 3, the array substrate includes a base substrate 100, a gate metal layer disposed on one side of the base substrate 100, a source-drain metal layer disposed on the side of the gate metal layer opposite to the base substrate 100, and an insulating layer disposed between the gate metal layer and the source-drain metal layer. The gate metal layer includes a gate line 101, the source-drain metal layer includes a data line 103, and the gate line 101 is arranged in an intersecting manner with the data line 103 to define a plurality of pixel units on the base substrate 100. For example, the pixel unit may refer to a sub-pixel of a plurality of sub-pixels of the pixel R, G or B. In addition to the plurality of pixel units, a plurality of holes are further disposed on the array substrate, and the holes extend from one side of the insulating layer opposite to the base substrate 100 toward the base substrate 100 (not shown in not shown in FIG. 1a to FIG. 3). That is, the holes extend toward one side of base substrate 100 close to the insulating layer. Those skilled in the art may recognize the holes do not intersect with the pixel units. According to the present application, stress in the array substrate may effectively be alleviated and the anti-bending capacity may be improved by disposing the holes in the insulating layer of the array substrate.

It should be noted that the insulating layer of the foldable array substrate may be made of, for example, inorganic insulating material. For example, the inorganic insulating material may be inorganic silicon material, and specifically, may be silicon nitride, silicon oxide or the like. In general, for example, when the inorganic silicon material is used for an insulating layer, a device failure is easily caused due to stress concentration of the film layer of the array substrate when the array substrate is bent. By disposing the holes in the insulating layer of the array substrate, the stress occurring in the insulating layer may be effectively dispersed, and the anti-bending performance of the device may be improved. Furthermore, the holes extend from one side of the insulating layer opposite to the base substrate toward the base substrate, but do not intersect with an area defined by each of the pixel units. That is to say, the holes need to avoid the pixel units of the array substrate to avoid affecting the display effect. In addition, those skilled in the art may know that the base substrate of the embodiments of the present application may be, for example, a flexible substrate in order to obtain a foldable array substrate.

In order to make the stress be better dispersed, as many holes as possible may be set under a premise of avoiding the pixel units of the array substrate. For example, the holes may be distributed in an array. For example, a plurality of holes are set around one pixel unit to separate the pixel unit from its adjacent pixel units, so that the pixel unit is formed an "isolated island" structure, and the stress dispersion effect is improved. Similarly, for example, a plurality of holes may be set around several pixel units to separate the several pixel units from a periphery to improve the stress dispersion effect. By setting a plurality of holes around the several pixel units, a punching process may be simplified while the stress dispersion effect is ensured, thereby reducing the punching cost.

It should be understood that the size of the holes may be different from each other according to differences of the size and resolution of screens. For example, the size of the holes may range from 2 um to 20 um. In general, the larger the size of a single hole, the better the stress dispersion effect of the single hole, and the process difficulty of preparing a smaller number of holes with a larger size is also relatively less. However, in a certain area, relative to a case of a small number of holes with a large size, a case of a large number of holes with a small size have a better stress dispersion effect. Therefore, the size of the holes may be further defined between 5 um and 10 um, so that the stress may be better reduced, the performance of the array substrate may be improved, and the process difficulty of punching is not increased excessively.

Similarly, the shape of sections perpendicular to an axis of each of the holes may be different, for example, the shape of the sections may be square, elliptical, circular or polygonal. For example, the shape of the sections of a hole may include at least two of a square, a circle, an ellipse, and a polygon at the same time. By setting holes with different shapes in the array substrate, different stress dispersion effects may be obtained. That is, by cooperation between the holes with different shapes, the stress dispersion performance may be further improved. In addition, a hole may also be a structure whose size varies along its axial direction. For example, for a circular hole, in a direction from one side of the circular hole opposite to the base substrate toward the base substrate, sections of the circular hole may be a structure whose diameter gradually becomes smaller. Furthermore, the axial directions of the holes may extend in a direction at a certain angle perpendicular to a direction of the array substrate, for example, the angle may be 5° to 10°. Thereby metal wirings of each metal layer of the array substrate may be avoided effectively, the holes may further extend toward the direction of the array substrate, and the performance of the array substrate is improved.

In an embodiment, two rows of pixel units adjacent to each other of an array substrate may include a preset punching area, and the holes mentioned above may be set in the preset punching area. That is to say, when the array substrate is designed (especially an array substrate with a high PPI), a certain area between two adjacent rows of the pixel units may be reserved artificially, and the certain area may be used for punching to eliminate the stress of the substrate array better. In general, for the array substrate with a high PPI, if the preset punching area is not reserved, the punching difficulty is very large due to a limitation of the punching process. Therefore, a circuit of the pixel units may be designed more compactly in a case of without reducing the size of the pixel units, thereby the preset punching area may be reserved and the display effect is not affected. For example, an orthographic projection of the preset punching area on the array substrate may not coincide with the metal wiring and a TFT switch. For example, the width of the preset punching area (a size in a column direction) may be in the range of 2 um to 10 um, thereby on the one hand, a circuit safety of the pixel units may be ensured during a punching operation, and on the other hand, a smooth operation of punching may be ensured. Moreover, since the size of holes punched is larger, an internal stress of the array substrate may be reduced significantly, and the anti-bending performance of the array substrate may be improved. Similarly, the preset punching area may also be reserved between two columns of pixel units adjacent to each other of the array substrate. For example, the width of the preset punching area (a size in a row direction) may be in the range of 2 um to 10 um, thereby the array substrate has an effect mentioned above after punching. The preset punching area is preferably an area free of metal, so that the anti-bending performance of the array substrate may be improved effectively under a premise of without affecting the electrical properties of the array substrate.

In an embodiment, for example, holes may include a first type of holes. The first type of holes do not intersect with a metal wiring of the gate metal layer and the metal of other metal layers in the array substrate. For example, the first type of holes may avoid the metal present in each metal layer, so as to extend toward a base substrate at the greatest extent. For example, the first type of holes may extend to a vicinity of the array substrate. As described above, in some cases, in order to avoid the metal of the metal layer, the first type of holes may also be an inclined hole. By setting the first type of holes, the stress in the array substrate may be reduced and dispersed effectively, and the performance of the array substrate may be improved.

Figure 1B:
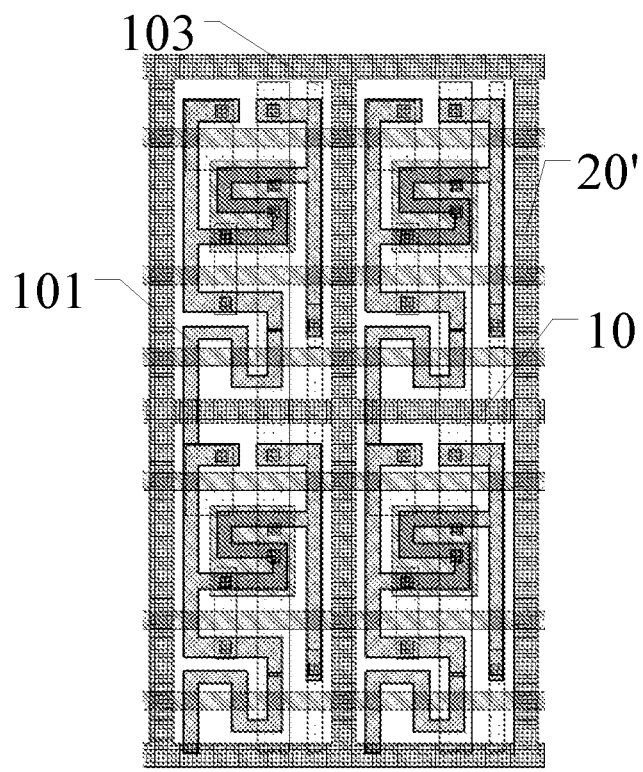
FIG. 1b is a schematic structural diagram of an array substrate according to another embodiment of the present application.
Figure 2:
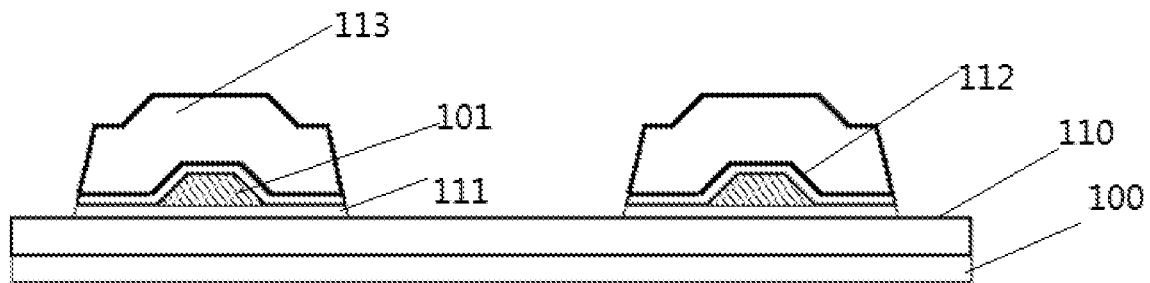
FIG. 2 is a schematic sectional diagram of the array substrate show in FIG. 1a alone A-A direction.
Figure 3:
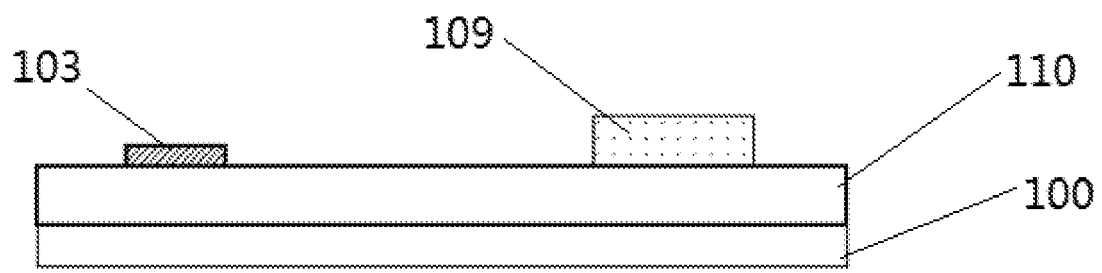
FIG. 3 is a schematic sectional diagram of the array substrate show in FIG. 1a alone B-B direction.

Still referring to FIG. 1a, FIG. 1b and FIG. 2, in an embodiment, an array substrate further includes a buffer layer 110 disposed on one side of the base substrate 100 and in contact with the base substrate 100, and a first type of holes extend from one side of an insulating layer 113 opposite to the base substrate 100 toward the base substrate 100 to the buffer layer 110. In a punching process, a dry etching or a wet etching may be adopted, for example, a portion of the buffer layer 110 may also be etched away by adopting the dry etching or the wet etching.

In an embodiment, for example, holes may further include a second type of holes, and the second type of holes extend from one side of an insulating layer 113 opposite to a base substrate 100 toward the base substrate 100 to a gate line 101. Alternatively, the second type of holes may also extend from the side of the insulating layer 113 opposite to the base substrate 100 toward the base substrate 100 to a wiring of other metal layers (a source-drain metal layer is formed after the insulating layer is formed, so other metal layers here may not include the source-drain metal layer), such as the metal in a capacitive layer of the array substrate of a OLED display device. When the holes are punched from the side of the insulating layer opposite to the base substrate, pixel units of the array substrate are avoided actively, but since metal layers exist between the insulating layer and the base substrate, the wiring of the metal layers may be encountered in the punching process. When punching by the dry etching or the wet etching, if the wiring of the metal layers is encountered, for example, an etching operation may be stopped to prevent a normal operation of the array substrate from being affected by etching off the gate line or other metal wirings. Although a depth of the second type of holes are relatively smaller, but from a macro perspective, the holes with smaller depth also increase a total number of holes, thereby improving the stress dispersion effect.

In an embodiment, an array substrate includes at least two rows of pixel units adjacent to each other. Still referring to FIG. 1a, between the two rows of pixel units, holes include a first hole-slot 10 extending along a length direction of a gate line 101 (a punching position may be, for example, the range defined by a rectangle indicated by a grid-like hatching as shown in FIG. 1a). For example, during a preparation process, holes may be punched in a row between the two adjacent rows of pixel units, and then when a source-drain metal layer is sputtered, the source-drain metal layer will raise the first hole-slot 10. That is to say, the source-drain metal layer sputtered on the array substrate is substantially the same, and after the source-drain metal layer are sputtered, the first hole-slot 10 arranged along the length direction of the gate line 101 still exist, only an inner wall and a bottom of the first hole-slot 10 are raised a little. When the source-drain metal layer is etched to form a data line 103, a space is formed at a position where the data line 103 arranged longitudinally intersects with the first hole-slot 10. For example, in the array substrate prepared in this way, a length of each first hole-slot 10 may be substantially equal to a length of the gate line 101, and the width may be slightly less than a distance between the two adjacent rows of pixel units. By punching in a row along the length direction of the gate line 101 and forming the first hole-slot 10 extending along the length direction of the gate line, two rows of pixel units may be separated effectively to block a stress propagation path, so that the stress of the array substrate may be reduced and dispersed effectively. Preferably, the holes are punched in a row between any two adjacent rows of the pixel units on the array substrate, so that a transfer of stress between rows is blocked, and a mechanical property of the array substrate is improved.

In the embodiment, as described above, in a case where the array substrate includes the buffer layer 110 disposed on the base substrate 100 and in contact with the base substrate 100, the first hole-slot 10 may extend from one side of the insulating layer 113 opposite to the base substrate 100 to the buffer layer 110. For example, a depth of a hole in a lateral direction along the length direction of the gate line 101 (a left-right direction in FIG. 1a and FIG. 1b) may be between 700 nm and 800 nm. However, the depth of the first hole-slot may vary with changes of process conditions, and may also vary with changes of thicknesses of some film layers, and this is not limited in the present application.

Referring to FIG. 1a, in an embodiment, holes further include a plurality of holes 20 extending along a length of a data line. For example, the holes are set between two adjacent columns of pixel units. It should be noted that, since a gate line 101 is under an insulating layer 113 punched, in order to prevent the holes punched from intersecting with the gate line 101, a way of punching the holes disconnectedly (discontinuously) at the gate line 101 may be adopted. As described above, the holes may be a plurality of spaced holes, and may also be a plurality of continuous holes distributed between two gate lines 101 and along the length direction of the data line 103.

In a case where a buffer layer 110 is disposed on an array substrate and in contact with one surface of the array substrate directly, a plurality of holes distributed along a length direction of a data line 103 may extend from one side of an insulating layer 113 opposite to the base substrate 100 to the buffer layer 110. The holes arranged at intervals along the length direction of the data line 103 and first hole-slots 10 arranged at intervals along the length direction of a gate line 101 cooperate with each other, which may reduce and disperse the stress during a bending process of the array substrate, and avoid device failure.

Still referring to FIG. 1b, in an embodiment, an array substrate includes at least two columns of pixel units adjacent to each other, and between the two columns of pixel units, holes include second hole-slots 20' extending along a length direction of a data line 103. Preferably, holes may be punched in a column between any two columns of pixel units of the array substrate. The second hole-slots 20' intersect with the first hole-slots 10 to form a mesh structure, and then the stress is prevented from being transmitted in a lateral or a longitudinal direction effectively (an up-down direction in FIG. 1a and FIG. 1b) when the array substrate is bent, and the bending resistance of the array substrate is improved.

It should be noted that, in the embodiment, since a punching layer (an insulating layer) is located above a gate metal layer and a gate line 101 is arranged in a lateral direction, the second hole-slots 20' interact with the gate line 101 inevitably when the holes are punched along the length direction of the data line 103. Thus, the second hole-slots 20' may include a portion extending from one side of an insulating layer 113 opposite to a base substrate 100 to a buffer layer 110 and a portion extending to the gate line 101. That is to say, depths of the second hole-slots 20' in a direction perpendicular to the base substrate 100 are not identical. Specifically, the second hole-slots 20' include: a portion extending to the gate line 101, a depth of the portion is a distance from the gate line 101 to the side of the insulating layer 113 opposite to the base substrate 100; and a portion extending to the buffer layer 110 (in a case where the buffer layer is disposed on a surface of the base substrate). When the same dry etching is adopted to perform a punching operation of the second hole-slots 20', for example, the dry etching may only etch non-metal material selectively, so that second hole-slots 20' with different depths may be obtained at one time, and a punching process is simplified.

Still referring to FIG. 1a to FIG. 3, in an embodiment, an array substrate further includes a capacitor layer 109 between a gate metal layer and a source-drain metal layer, an insulating layer includes an insulating layer 113 (a first insulating layer 113) set between the capacitor layer 109 and the source-drain metal layer and a second insulating layer 112 set between the capacitor layer and the gate metal layer. Further, one surface of the array substrate, for example, further includes a buffer layer 110, an active layer and a third insulating layer 111 set between the active layer and the gate metal layer 101 sequentially. In the case, the first insulating layer 113 set between the capacitor layer 109 and the source-drain metal layer may be served as a punching initiating layer. That is to say, each type of holes in the above embodiments may be a structure extending from one side of the first insulating layer 113 opposite to a base substrate 100 toward the base substrate 100.

It should be noted that a structure of the array substrate of the embodiment is a top gate structure, but the solution of the present application is not limited to the top gate structure, and the array substrate may also be a bottom gate structure.

In an embodiment, each insulating layer may be an inorganic insulating layer, and the inorganic insulating layer may be made of silicon material, such as inorganic silicon material. Further, the inorganic silicon material may include at least one of silicon oxide and silicon nitride. Generally, the silicon material is adopted as the insulating material, and stress is easily generated or accumulated in each film layer of the array substrate, holes of the embodiments of the present application may disperse and reduce the stress in the film layer effectively, thereby improving the performance of the array substrate.

The above embodiments may be combined with each other and have corresponding effects.

The array substrate of the present application may be applied in various foldable display devices, but the present application is not limited to the application of the array substrate.

Another aspect of the present application provides a display device including the above array substrate, such as an OLED display device. According to the OLED display device, by punching holes outside the pixel unit of the array substrate, a phenomenon of stress concentration is improved effectively, thereby improving the bending resistance of the device.

Figure 4:
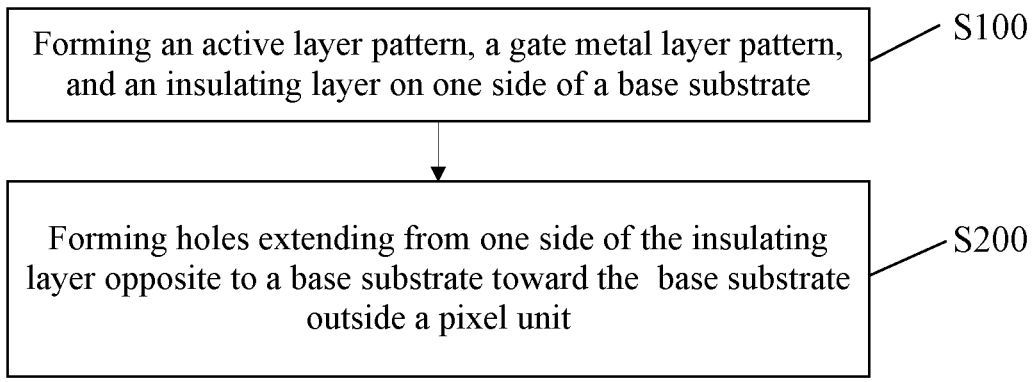
FIG. 4 is a flow chart of preparing an array substrate of an embodiment of the present application.

Another aspect of the present application provides a preparation method of the above array substrate. Referring to FIG. 4, the method may include the following steps:

S100: forming an active layer pattern, a gate metal layer pattern, and an insulating layer on one side of a base substrate, the gate metal layer pattern includes a gate line; and S200: forming a plurality of holes extending from one side of the insulating layer opposite to a base substrate toward the base substrate outside a pixel unit, and the holes do not intersect with the pixel unit.

In S100, specifically, both the active layer pattern and the gate metal layer pattern in the step may be prepared by photolithography. For example, a buffer layer is deposited on the base substrate firstly, then an active layer is deposited on the buffer layer, and the active layer pattern is formed by photolithography. Subsequently, a gate metal layer is deposited on the active layer, and a gate line and a gate connected to the gate line are formed by photolithography. Subsequently, the insulating layer may also be deposited on the gate metal layer, for example, the insulating layer may be made of inorganic material (for example, the inorganic material may be inorganic silicon material including at least one of silicon oxide and silicon nitride). Subsequently, a capacitor layer may be further deposited on the insulating layer, and the capacitor layer pattern is formed by a photolithographic masking method. Similarly, the insulating layer is deposited on the capacitor layer pattern, and as described above, the insulating layer may be made of inorganic material (for example, the inorganic material may be inorganic silicon material including at least one of silicon oxide and silicon nitride).

In S200, for example, in a case where a plurality of insulating layers are present, the holes are punched from the insulating layer farthest from the base substrate toward a direction close to the base substrate. The holes may be punched by adopting the dry etching or the wet etching. For example, in a case where a punching position avoids the pixel unit of the array substrate, as many holes as possible may be punched so as to minimize the stress between film layers of the array substrate. In general, the holes may include two types of holes, one type of holes are holes extending from one side of the insulating layer farthest from the base substrate opposite to a base substrate to a vicinity of the base substrate (the holes may not be punched on the base substrate to avoid affecting display effect), and the other type of holes are holes extending from the side of the insulating layer farthest from the base substrate opposite to a base substrate to a metal wiring of the metal layer below the insulating layer of the array substrate.

In addition, punching holes in a row may also be selected. That is, between two adjacent rows of pixel units, the holes are punched by the dry etching or the wet etching to form hole-slot structures. The hole-slot structures may avoid a transfer of the stress between inner film layers effectively and improve the mechanical property of the array substrate.

A method of punching the holes in a row may specifically be, but is not limited to, the following methods:

designing a mask pattern, the mask pattern includes an exposed area corresponding to a position to be punched on the insulating layer, for example, the exposed area of the mask pattern may be elongated, so that the mask pattern includes a plurality of strips corresponding to the positions to be punched on the insulating layer, and it should be understood that the strips are located between two adjacent rows of pixel units on the array substrate respectively;

coating a photoresist on the insulating layer, performing an exposure process, and removing the photoresist of a preset punching area; and etching the preset punching area by the dry etching or the wet etching until the buffer layer is exposed (in a case where the buffer layer is deposited on a surface of the array substrate), at this time, on the array substrate, a first hole-slot extending along a length direction of a gate line is formed between the two adjacent rows of pixel units.

In addition, punching the holes in a column may also be selected. That is, between the two adjacent columns of pixel units, the holes are punched in a column by dry etching or wet etching to form a second hole-slot. The second hole-slot may avoid a transfer of the stress between inner film layers effectively and improve the mechanical properties of the array substrate. A method of punching the holes in a column is similar to the method of punching the holes in a row described above, and will not be described redundantly herein. However, it should be noticed that when the holes are punched in a column, since the holes may intersect with a gate line, the holes are stopped to be punched when the gate line is to be etched. For example, etching may be continued at a position where there is no gate metal (the gate line) until the second hole-slot reaches the buffer layer.

Figure 5:
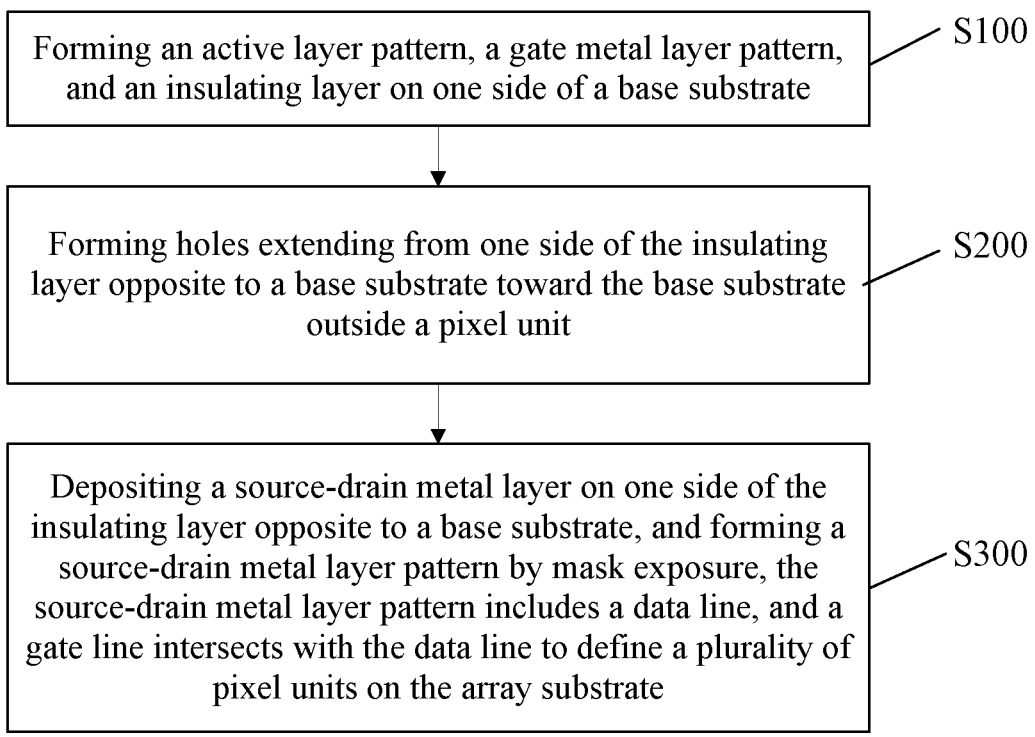
FIG. 5 is a flow chart of preparing an array substrate of an embodiment of the present application.

Referring to FIG. 5, when preparing the array substrate, after the above steps, the method further includes the following steps:

S300: depositing a source-drain metal layer on one side of an insulating layer opposite to a base substrate, and forming a source-drain metal layer pattern by mask exposure.

It should be noted that, for a conventional hole structure (i.e., the first type of hole and the second type of hole described above), for example, after holes are formed by S200, the holes are performed a shielded protection to avoid metal material entering and blocking the holes when a source-drain metal layer is deposited. For first hole-slots formed by punching the holes in a row, for example, after S200, the source-drain metal layer may be deposited directly, that is, the first hole-slots are not required to be shielded, thereby simplifying the punching process. For the second hole-slots formed by punching the holes in a column, since the second hole-slots may intersect with a gate line, after S200, for example, the second hole-slots may be performed a shielded protection to avoid metal material entering the second hole-slots and contacting with the gate line to cause a short circuit when the source-drain metal layer is deposited. Of course, the above description of a punching manner does not mean that only a corresponding hole may be punched by adopting the above manner, and only a punching method is provided.

The above descriptions are merely preferred embodiments of the present application, but not intended to limit the present application. Any modification and equivalent replacement made without departing from the spirit and principle of the present application shall fall within the protection scope of the present application.

What is claimed is:

1. A foldable array substrate, comprising: a base substrate, a gate metal layer disposed on one side of the base substrate, a source-drain metal layer disposed on the side of the gate metal layer opposite to the base substrate, and an insulating layer disposed between the gate metal layer and the source-drain metal layer, wherein
    the gate metal layer comprises a gate line, the source-drain metal layer comprises a data line, and the gate line is arranged in an intersecting manner with the data line to define a plurality of pixel units on the base substrate,
    the foldable array substrate further comprising a plurality of holes, which are disposed between adjacent pixel units of the plurality of pixel units, and extend from the side of the insulating layer opposite to the base substrate toward the base substrate.

2. The foldable array substrate according to claim 1, further comprising a preset punching area between two rows of pixel units adjacent to each other and/or between two columns of pixel units adjacent to each other, wherein the plurality of holes are disposed in the preset punching area.

3. The foldable array substrate according to claim 2, wherein the width of the preset punching area is in the range of 2 micrometers to 10 micrometers.

4. The foldable array substrate according to claim 1, wherein the plurality of holes at least comprise a first type of holes, the first type of holes do not intersect with the metal of each metal layer of the foldable array substrate.

5. The foldable array substrate according to claim 4, wherein the first type of holes extend from one side of the insulating layer opposite to the base substrate to the base substrate.

6. The foldable array substrate according to claim 4, further comprising a buffer layer disposed on the side of the base substrate and in contact with the base substrate, wherein the first type of holes extend from one side of the insulating layer opposite to the base substrate toward the base substrate to the buffer layer.

7. The foldable array substrate according to claim 1, wherein the plurality of holes further comprises a second type of holes, the second type of holes extend from one side of the insulating layer opposite to the base substrate to a metal wiring in the gate metal layer.

8. The foldable array substrate according to claim 1, further comprising at least two rows of pixel units adjacent to each other, wherein the plurality of holes comprise a first hole-slot extending along a length direction of the gate line between the two rows of pixel units.

9. The foldable array substrate according to claim 8, further comprising a buffer layer disposed on the side of the base substrate and in contact with the base substrate, wherein the first hole-slot extends from one side of the insulating layer opposite to the base substrate to the buffer layer.

10. The foldable array substrate according to claim 9, wherein the plurality of holes further comprise a plurality of holes extending along a length direction of the data line.

11. The foldable array substrate according to claim 10, wherein the plurality of holes extending along a length direction of the data line extend from one side of the insulating layer opposite to the base substrate to the buffer layer.

12. The foldable array substrate according to claim 1, further comprising at least two columns of pixel units adjacent to each other, wherein the plurality of holes comprise a second hole-slot extending along a length direction of the data line between the two columns of pixel units.

13. The foldable array substrate according to claim 12, wherein the second hole-slot comprises a portion extending from one side of the insulating layer opposite to the base substrate to the buffer layer and a portion extending to the gate line.

14. The foldable array substrate according to claim 1, further comprising a capacitor layer disposed between the gate metal layer and the source-drain metal layer,
wherein the insulating layer comprises a first insulating layer disposed between the capacitor layer and the source-drain metal layer, and a second insulating layer disposed between the capacitor layer and the gate metal layer.

15. The foldable array substrate according to claim 1, wherein the insulating layer is made of inorganic silicon material.

16. The foldable array substrate according to claim 15, wherein the inorganic silicon material comprises at least one of silicon oxide and silicon nitride.

17. An OLED display device, comprising a foldable array substrate, wherein the foldable array substrate comprises:
a base substrate, a gate metal layer disposed on one side of the base substrate, a source-drain metal layer disposed on the side of the gate metal layer opposite to the base substrate, and an insulating layer disposed between the gate metal layer and the source-drain metal layer, wherein
the gate metal layer comprises a gate line, the source-drain metal layer comprises a data line, and the gate line is arranged in an intersecting manner with the data line to define a plurality of pixel units on the base substrate,
the foldable array substrate further comprising a plurality of holes, which are disposed between adjacent pixel units of the plurality of the pixel units, and extend from the side of the insulating layer opposite to the base substrate toward the base substrate.

18. A preparation method of a foldable array substrate, comprising:
forming an active layer pattern, a gate metal layer pattern, and an insulating layer on one side of a base substrate, wherein the gate metal layer pattern comprises a gate line; and
forming a plurality of holes extending from one side of the insulating layer opposite to the base substrate toward the base substrate, wherein the plurality of holes are formed between adjacent pixel units of the plurality of pixel units.

19. The preparation method of the foldable array substrate according to claim 18, wherein the forming a plurality of holes extending from one side of the insulating layer opposite to the base substrate toward the base substrate comprising:
forming a first hole-slot extending along a length direction of the gate line between at least one pair of two rows of pixel units adjacent to each other.

20. The preparation method of the foldable array substrate according to claim 19, further comprising forming a source-drain metal layer pattern after the forming a plurality of holes extending from one side of the insulating layer opposite to the base substrate toward the base substrate, wherein the source-drain metal layer pattern comprises a data line,
wherein the forming a plurality of holes extending from one side of the insulating layer opposite to the base substrate toward the base substrate further comprises:
forming a second hole-slot extending along a length direction of the date line between at least one pair of two columns of pixel units adjacent to each other.

* * * * *